(12) United States Patent
Fukuda et al.

(10) Patent No.: US 7,976,896 B2
(45) Date of Patent: Jul. 12, 2011

(54) METHOD OF PROCESSING A SUBSTRATE AND APPARATUS PROCESSING THE SAME

(75) Inventors: Yoshiteru Fukuda, Koshi (JP); Nobuhiro Ogata, Koshi (JP); Takayuki Ishii, Koshi (JP); Keiji Tanouchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1092 days.

(21) Appl. No.: 11/540,629

(22) Filed: Oct. 2, 2006

(65) Prior Publication Data

US 2007/0082134 A1 Apr. 12, 2007

(30) Foreign Application Priority Data

Oct. 11, 2005 (JP) .................................. 2005-296392
Jul. 13, 2006 (JP) .................................. 2006-192587

(51) Int. Cl.
*B05D 3/12* (2006.01)
(52) U.S. Cl. .......... 427/240; 427/336; 427/352; 134/26; 134/33; 118/52; 438/758
(58) Field of Classification Search .................. 427/240, 427/336, 352; 118/52; 134/26, 33; 438/758
See application file for complete search history.

(56) References Cited

U.S. PATENT DOCUMENTS 5,939,139 A 8/1999 Fujimoto
2005/0115671 A1 6/2005 Araki
2006/0272676 A1* 12/2006 Iwase et al. .................. 134/2

FOREIGN PATENT DOCUMENTS

| JP | 6-326067 A | 11/1994 |
|---|---|---|
| JP | 8-51064 A | 2/1996 |
| JP | 08-264412 | 10/1996 |
| JP | 9-106980 A | 4/1997 |
| JP | 10-209143 A | 8/1998 |
| JP | 2948501 | 7/1999 |
| JP | 2003-045788 | 2/2003 |
| JP | 2005-191511 A | 7/2005 |

OTHER PUBLICATIONS

English translation of JP 2948501, published Oct. 11, 1996.*
English translation of JP 2003-045788 A, published Feb. 14, 2003.*
Japanese Office Action issued Jan. 18, 2011, in Patent Application No. 2006-192587 with English Translation.

* cited by examiner

*Primary Examiner* — Kirsten C Jolley
(74) *Attorney, Agent, or Firm* — Oblon, Spivak, McClelland, Maier & Neustadt, L.L.P.

(57) ABSTRACT

A spin chuck rotatably holds a semiconductor wafer, while resist is dropped on a surface of the semiconductor wafer through a resist application nozzle and thus applied thereon, and before the resist applied on the wafer dries, a cleaning liquid is supplied through a bevel cleaning nozzle to a portion of the wafer located at a peripheral portion thereof in a vicinity of a beveled portion to remove the resist adhering to the beveled portion. Thereafter, a film of the resist that is formed on the surface of the wafer is dried.

13 Claims, 11 Drawing Sheets

METHOD OF PROCESSING A SUBSTRATE AND APPARATUS PROCESSING THE SAME

BACKGROUND OF THE INVENTION

1. Field of the Invention

The present invention relates generally to methods of processing substrates and apparatuses processing substrates and particularly to such methods and apparatuses for example applying resist for example on a semiconductor wafer and removing an excess of the resist that adheres to the wafer at a peripheral edge.

2. Description of the Background Art

Generally in fabricating a semiconductor device a semiconductor wafer (hereinafter simply referred to as a "wafer") is provided thereon with a thin film formed of indium tin oxide (ITO), an electrode pattern and the like, and to do so, photolithography is employed. In photolithography, photoresist is applied on a wafer to form a film of the resist which is in turn exposed to light in accordance with a predetermined circuit pattern which is in turn developed to form the circuit pattern in the film of the resist.

In such photolithography process when the resist is applied it is typically dropped on the wafer, which is rotated to centrifugally apply a film of the resist on a surface thereof. This resist application process results in the wafer having a side edge with an excess of the resist adhering thereto, and to remove such excess of the resist, a method is known, for example as described in Japanese Patent Laying-Open No. 2003-045788. According to this method, resist is applied on a wafer, spun away and dried, and thereafter the resist that adheres to the wafer at a peripheral edge is removed.

Another method is also known for example as disclosed in Japanese Patent Laying-Open No. 08-264412. The method provides more than once the step of causing a cleaning liquid to run round a wafer from a back surface to a front surface to remove resist or a similar applied liquid adhering to the wafer at a peripheral edge.

However, if the former method is applied, i.e., if as described in Japanese Patent Laying-Open No. 2003-045788, a wafer having resist applied thereon and dried is subsequently supplied at its back surface with a cleaning liquid to remove the resist, a long period of time may be required to remove the resist adhering to the wafer at a peripheral edge and the cleaning liquid may remain on the wafer. In particular, if the cleaning liquid is for example cyclohexanone ($C_6H_{10}O$) a long period of time is required to remove the resist.

Furthermore, for the latter method, i.e., as disclosed in Japanese Patent Laying-Open No. 08-264412, the cleaning liquid running round the wafer and reaching its front, peripheral edge causes the resist to scatter and again adhere to the wafer, resulting in reduced product yields.

Furthermore in order to achieve increased yields a wafer has its peripheral edge also consumed maximally to maximally obtain chips, and to do so, in recent years, the conventionally employed edge bead remover (EBR) process, i.e., a process for removing resist by approximately 3 mm as measured from the peripheral edge of the wafer, is not performed. If the EBR process is not performed, however, an arm holding the wafer may be contaminated by the resist, which may again adhere to the wafer.

SUMMARY OF THE INVENTION

The present invention contemplates a method of processing a wafer and apparatus processing the same that ensures that a liquid which is applied on a substrate to be processed and adheres to the substrate at a peripheral edge is removed, and that also allows the substrate to be processed within a reduced period of time and can also prevent the liquid from again adhering to the substrate.

The present method is a method of processing a substrate, performing a process to form a film applied on a surface of a substrate to be processed, including the steps of: rotating the substrate with a liquid to be applied dropped thereon to form a film applied on a surface of the substrate; before the liquid applied on the substrate as the substrate is rotated dries, supplying a cleaning liquid to a portion of the substrate located at a peripheral edge thereof in a vicinity of a beveled portion to remove the liquid applied on the beveled portion; and after the step of supplying the cleaning liquid, drying a film formed of the liquid applied on the substrate.

As referred to herein, a beveled portion is a portion of a substrate to be processed that is located at a peripheral edge of the substrate and has upper and lower corners beveled. It refers to a portion defined by a side end surface and surfaces adjacent to and upper and lower, respectively, than the side end surface.

In the present method preferably the step of rotating the substrate includes the step of spinning the liquid applied on the substrate away from the surface of the substrate and the step supplying the cleaning liquid starts within a period of time of five seconds counted from the step of spinning.

Furthermore in the present method preferably the step of supplying the cleaning liquid includes supplying the cleaning liquid from a back surface of the substrate toward the beveled portion.

Furthermore the present method preferably further includes, after the step of drying, the step of supplying a cleaning liquid for cleaning a back surface of the substrate.

Furthermore in the present method preferably in the step of supplying the cleaning liquid, the substrate is rotated at a speed allowing the cleaning liquid to run round the substrate to reach a portion of the beveled portion located at a surface upper than a side end of the substrate.

Furthermore in the present method preferably in the step of supplying the cleaning liquid the substrate is rotated at a speed within a range of 500 rpm to 2,000 rpm and no faster than that applied to rotate the substrate in the step of drying. Accordingly, the cleaning liquid can run round the substrate to reach a portion of the beveled portion located at a surface upper than a side end of the substrate, and does not reach a farther inner portion of the substrate.

Furthermore in the present method preferably the step of supplying the cleaning liquid is performed for a period of time set depending on a type and a viscosity of the liquid to be applied, and a type of a solvent of the cleaning liquid and a viscosity and a temperature of the cleaning liquid.

Furthermore in the present method in one aspect a nozzle reserving cleaning liquid is provided at a position adjacent to an end portion of the substrate and the step of supplying the cleaning liquid causes the cleaning liquid to contact only the beveled portion for cleaning.

The present apparatus processing a substrate includes: a unit holding and rotating a substrate to be processed; a unit dropping a liquid to be applied on a surface of the substrate to supply the liquid; and a bevel cleaning nozzle supplying a cleaning liquid to a portion of the substrate located at a peripheral portion thereof in a vicinity of a beveled portion.

The present apparatus preferably further includes a rear-surface cleaning nozzle supplying cleaning liquid to a portion of the substrate located at a back surface adjacent to the beveled portion.

Furthermore in the present apparatus preferably the rear-surface cleaning nozzle is provided at two opposite positions opposite the back surface of the substrate.

Furthermore in the present apparatus preferably the bevel cleaning nozzle is provided at two opposite positions opposite a back surface of the substrate.

Furthermore in the present apparatus preferably the bevel cleaning nozzle includes a plurality of assistive cleaning nozzles supplying a cleaning liquid from a position immediately under an area of the substrate inner than and adjacent to the beveled portion to the area inner than and adjacent to the beveled portion.

Furthermore in the present apparatus preferably the bevel cleaning nozzle jets the cleaning liquid at an angle adjustable with respect to the substrate.

Furthermore in the present apparatus preferably the bevel cleaning nozzle is connected to a source of the cleaning liquid by a duct provided with a temperature adjuster adjusting the cleaning liquid in temperature.

Furthermore the present apparatus preferably further includes a nozzle provided adjacent to an end portion of the substrate and reserving cleaning liquid contacting the peripheral portion of the substrate.

The present invention thus configured can provide the following effects:

(1) In accordance with the present invention in one aspect a substrate to be processed with a liquid to be applied dropped thereon is rotated to apply the liquid on a surface of the substrate to form a film of the liquid thereon. In doing so, before the liquid applied on the substrate dries, a cleaning liquid is supplied to the substrate at a peripheral portion in a vicinity of a beveled portion to remove the liquid applied thereon. This can reduce an effect on a front surface of the substrate and thus remove the liquid applied on the substrate and in a subsequent drying step the film applied on the substrate at the peripheral portion can be adjusted in thickness. This can ensure that the liquid applied on and adhering to the substrate at the peripheral portion can be removed, and can also contribute to a reduced processing period of time;

(2) In accordance with the present invention in another aspect after the applied liquid has dried, a cleaning liquid can be supplied to the substrate at a peripheral portion on a lower (or back) surface adjacent to the beveled portion to remove the applied liquid that has run round and thus reached the back surface of the substrate. In addition to effect (1), this can prevent the applied liquid from again adhering to a surface of the substrate. Increased product yields can thus be achieved.

(3) In accordance with the present invention in still another aspect a bevel cleaning step can be performed with a cleaning liquid supplied to run round from two opposite positions on a back surface of the substrate. The cleaning liquid can thus be supplied efficiently. Thus in addition to effects (1) and (2) this can ensure that the applied liquid is prevented from again adhering to the substrate. Increased product yields can thus be achieved.

(4) In accordance with the present invention in still another aspect a plurality of assistive cleaning nozzles provided at a position immediately under an area of the substrate inner than and adjacent to the beveled portion can supply the area with a cleaning liquid. In addition to effects (1) to (3) this can achieve further steadily improved bevel cleaning performance and a reduced cleaning period of time. Furthermore, it can also prevent: a residue of the cleaning liquid in a portion having a mark formed therein, such as a laser mark formed in a vicinity of the beveled portion; a turbulent flow of the cleaning liquid that is attributed to the portion having the mark formed therein; and the like.

(5) In accordance with the present invention in still another aspect a bevel cleaning nozzle can jet the cleaning liquid at an angle adjustable with respect to the substrate. In addition to effects (1) to (4) this can remove liquid applied to different types of substrates to be processed.

(6) In accordance with the present invention in still another aspect the bevel cleaning step can be performed with the cleaning liquid adjusted in temperature in accordance with that of the liquid applied. This can reduce an effect on a film applied that is attributed to the temperature of the cleaning liquid. In addition to effects (1) to (5) this allows the film applied to be uniform in thickness.

(7) In accordance with the present invention in still another aspect a nozzle provided adjacent to an end portion of the substrate to reserve the cleaning liquid can be employed in a cleaning step to cause the cleaning liquid to contact only the beveled portion for cleaning. This can remove the applied liquid that remains on the substrate at a peripheral portion thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter a best mode for the present invention will be described with reference to the drawings more specifically. Hereinafter will be described a substrate processing apparatus of the present invention applied to an apparatus applying resist on a semiconductor wafer.

First Embodiment

Figure 1A:
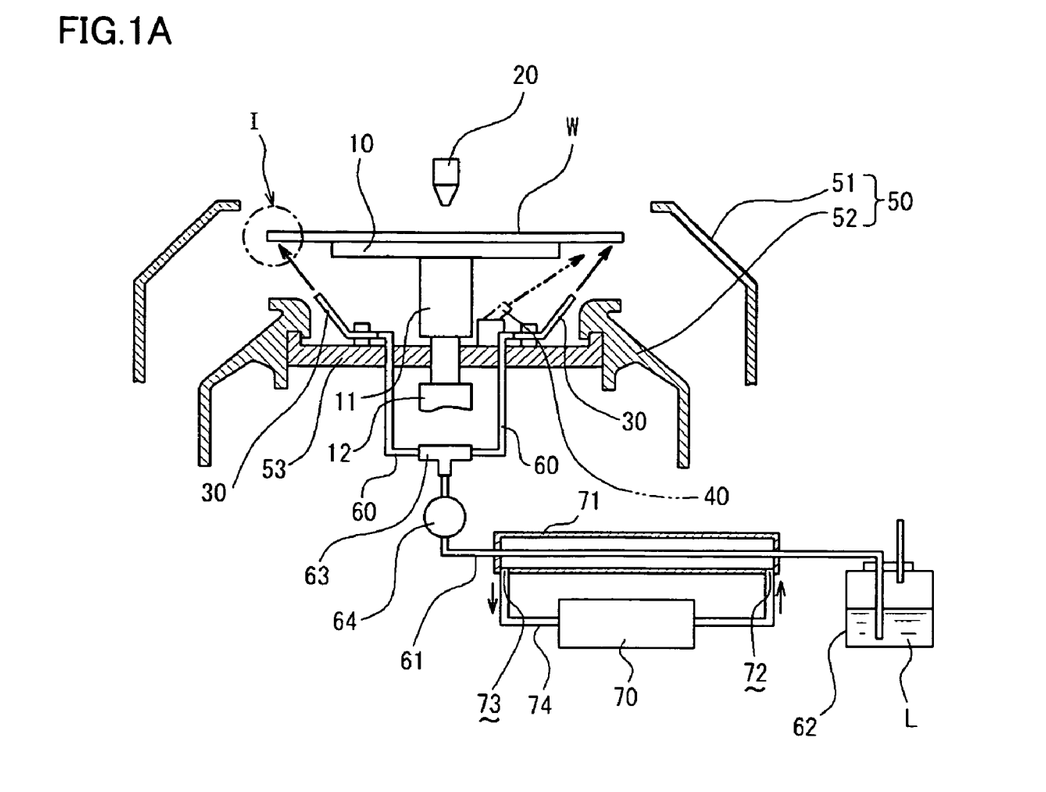
FIG. 1A is a schematic cross section of a first embodiment of a resist application apparatus with a substrate processing apparatus of the present invention applied thereto.
Figure 1B:
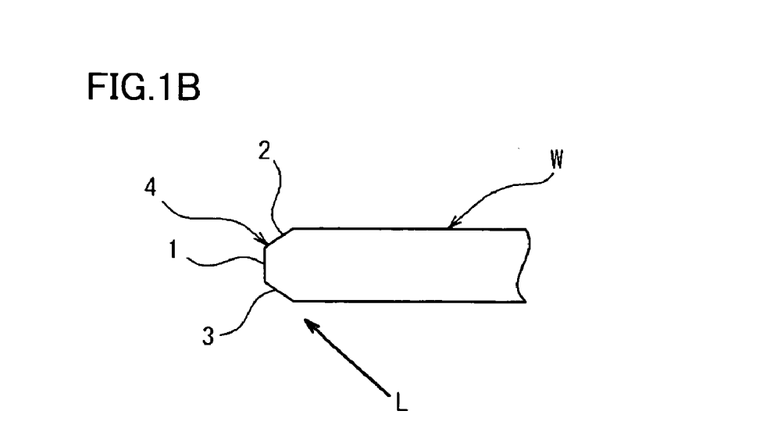
FIG. 1B is an enlarged view of a portion I shown in FIG. 1A.

With reference to FIGS. 1A and 1B the present embodiment provides a resist application apparatus including a spin chuck 10 serving as a unit for holding and rotating a semiconductor wafer W (hereinafter simply referred to as "wafer" W) serving as a substrate to be processed, a resist application nozzle 20 serving as a unit dropping a liquid to be applied, e.g., resist liquid, on a surface of wafer W for supplying the liquid, and a bevel cleaning nozzle 30 supplying a beveled portion 4, which is located at a peripheral edge of wafer W, with a solvent, such as cyclohexanone ($C_6H_{10}O$), serving as a cleaning liquid. Herein, beveled portion 4 is a portion corresponding to upper and lower corners of the peripheral edge of wafer W, that is beveled, as shown in FIG. 1B. It refers to a portion defined by a side end surface 1, and surfaces 2 and 3 adjacent to and upper and lower, respectively, than side end surface 1.

Furthermore, the resist application apparatus is provided with a back surface cleaning nozzle 40 supplying a portion of wafer W located on a back surface thereof 50 mm away from the peripheral edge with a solvent, such as cyclohexanone ($C_6H_{10}O$), serving as a cleaning liquid.

Spin chuck 10 is accommodated in a cup 50 formed of an outer cap 51 movable upward and downward and an inner cup 52 and is connected to a motor 12 via a shaft of rotation 11 capable of moving upward and downward and thus penetrating a bottom 53 provided in the form of a disk closing inner cup 52 at its inner circumference. Motor 12 is adapted to rotate at a predetermined speed in response to a control signal issued from a controller (not shown). Furthermore, spin chuck 10 is configured to be movable upward and downward by an elevator unit (not shown). Spin chuck 10 receives wafer W from a carrier arm (not shown) arranged above spin chuck 10, and movable horizontally, or in a direction X-Y, and vertically, or in a direction Z, and also horizontally rotatable and attracts and holds wafer W, and after the wafer has resist applied thereon, spin chuck 10 ascends to pass wafer W to the carrier arm situated above spin chuck 10.

Resist application nozzle 20 is adapted to be connected to a source of resist via a feeding duct (not shown) and movable by an arm (not shown) to over a center of wafer W and to an external waiting position.

Furthermore, bevel cleaning nozzle 30 is arranged at two opposite positions sandwiching a center of bottom 53, as shown in FIG. 1A. In this example, each bevel cleaning nozzle 30 is connected via a branched feed pipe 60 and a main feed pipe 61 to a cleaning liquid reserver tank 62 serving as a source of the cleaning liquid. More specifically, main feed pipe 61 has one end connected to cleaning liquid reserver tank 62 and the other end connected via a coupling 63 to branched feed pipe 60, via which bevel cleaning nozzle 30 is connected to cleaning liquid reserver tank 62. In this example main feed pipe 61 at a portion adjacent to coupling 63 is provided with a valve 64 opened and closed in response to a control signal issued from a controller (not shown). Cleaning liquid reserver tank 62 reserves a cleaning liquid L, which is supplied as it is pressurized by an inert gas, such as nitrogen ($N_2$) gas, used to apply pressure for delivery.

Note that as well as bevel cleaning nozzle 30, back surface cleaning nozzle 40 may be provided at two opposite positions sandwiching the center of bottom 53.

Furthermore, main feed pipe 61 is provided at a portion thereof with a temperature adjuster 70 operating in accordance with the temperature of the resist to adjust that of the cleaning liquid (cyclohexanone ($C_6H_{10}O$)) flowing through main feed pipe 61. As shown in FIG. 1A, temperature adjuster 70 is configured to adjust the cleaning liquid in temperature to have a predetermined temperature, e.g., room temperature, by circulating and thus supplying a thermal, medium, such as water, via a circulation path 74 connected to an inlet 72 and an outlet 73 provided at opposite ends, respectively, of a temperature adjusting chamber 71 surrounding main feed pipe 61 airtight and watertight.

Figure 2:
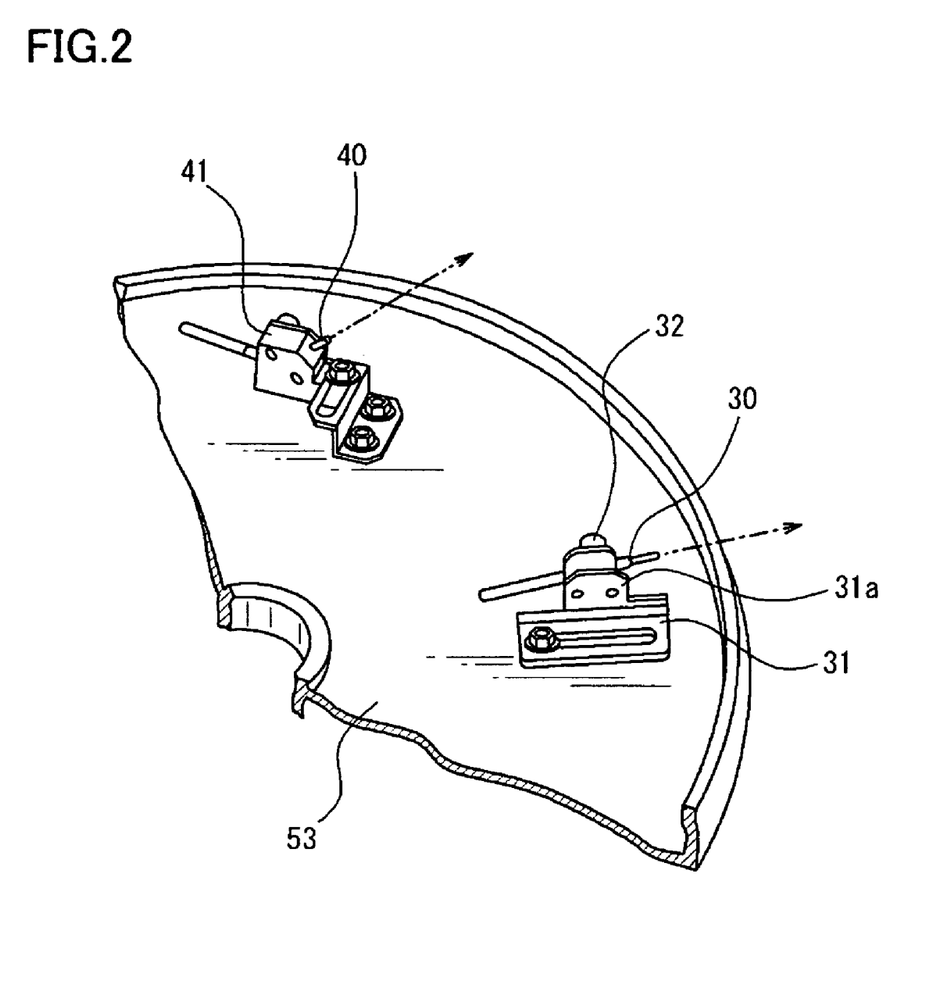
FIG. 2 is a perspective view of a main portion, showing how a bevel cleaning liquid nozzle and a back surface cleaning liquid nozzle are mounted in accordance with the present invention.
Figure 3:
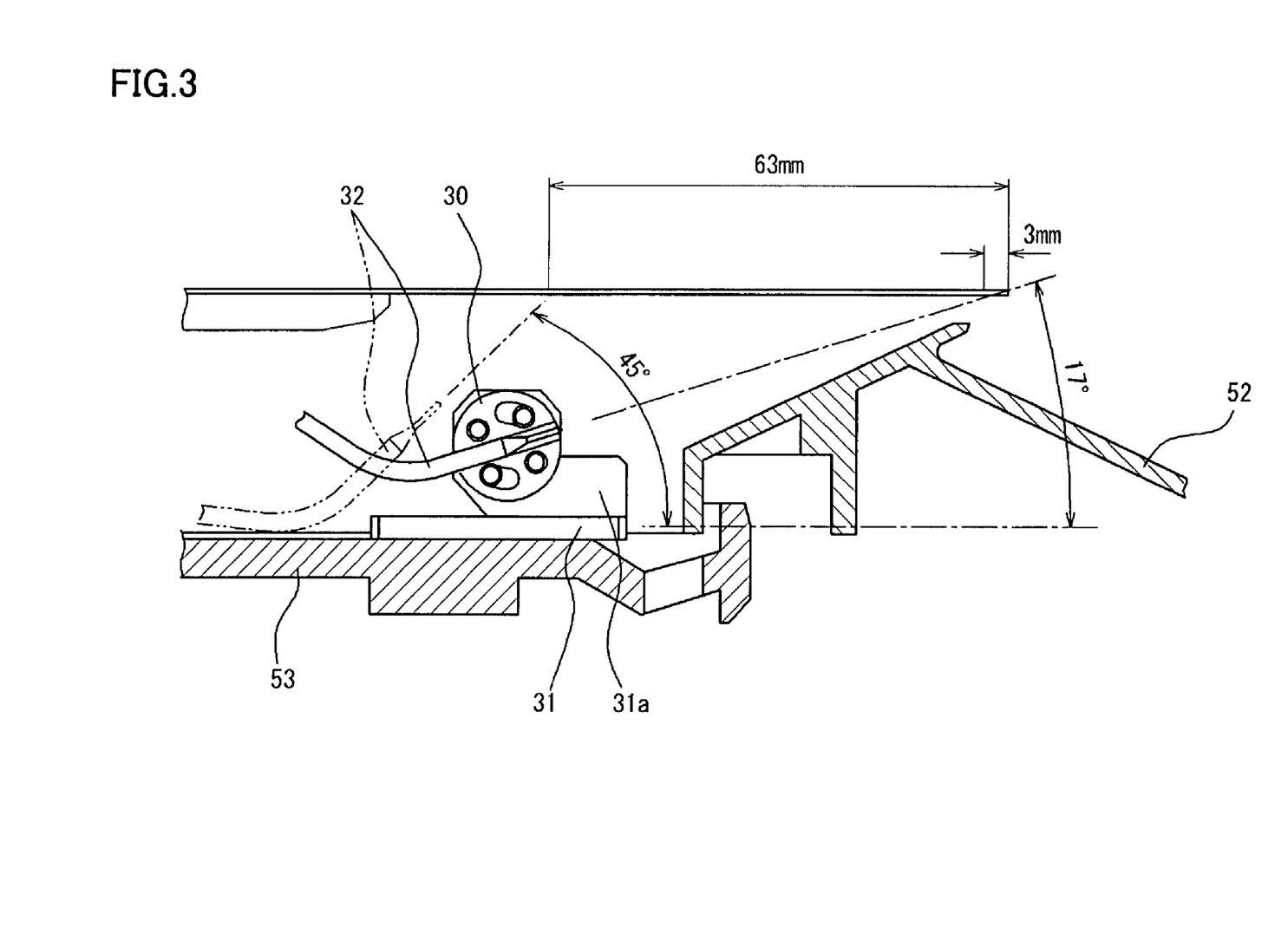
FIG. 3 is a cross section showing how the bevel cleaning liquid nozzle is mounted in the present invention.

Furthermore, as shown in FIGS. 2 and 3, bevel cleaning nozzle 30 is mounted to be displaceable in angle perpendicularly by a nozzle holder 32 rotatatively mounted to an erect piece 31a of a holding base 31 movable relative to an upper surface of bottom 53 radially. Bevel cleaning nozzle 30 thus configured is held to be adjustable in angle in a range of 17° to 45° relative to bottom 53 parallel to wafer W held by spin chuck 10 and is also held to be adjustable to be moved to a position 3 mm to 63 mm away from the side end surface of the peripheral edge of wafer W toward the center of wafer W.

Figure 4A:
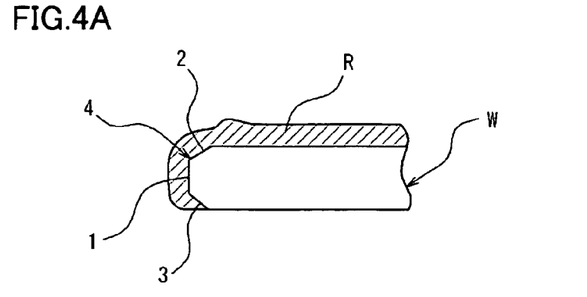
FIGS. 4A to 4D are schematic cross sections showing a process of a method of processing a substrate in the present invention.
Figure 4B:
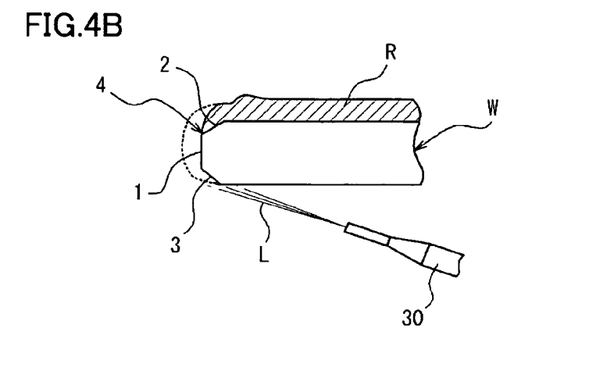
Figure 4C:
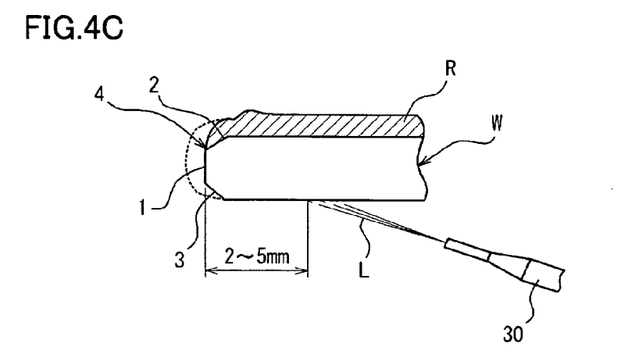

Bevel cleaning nozzle 30 thus configured allows wafers different in diameter, notched differently in geometry, and the like to be supplied with a cleaning liquid jetted (or supplied) toward beveled portion 4 of the peripheral edge of wafer W as the nozzle can angularly and positionally be adjusted so that, as shown in FIG. 4B, the cleaning liquid can be supplied to the peripheral edge at side end surface 1 and surface 3 adjacent to and lower than side end surface 1, or, as shown in FIG. 4C, the cleaning liquid can be supplied in a vicinity of beveled portion 4, i.e., at a lower surface of the wafer adjacent to beveled portion 4 and 2-5 mm away from a side end of the wafer. Thus supplying the cleaning liquid to a position 2-5 mm away from the side end of wafer W having a notch can prevent the cleaning liquid from impinging on the notch and thus splashing.

Back surface cleaning nozzle 40 is held as shown in FIG. 2. More specifically, it is held on the upper surface of bottom 53 by a nozzle holder 41 at a position 90° offset from that at which bevel cleaning nozzle 30 is provided. Back surface cleaning nozzle 40 is a nozzle cleaning off the resist liquid running round wafer W and reaching and thus contaminating its back surface. Back surface cleaning nozzle 40 is set to supply cleaning liquid to a portion of wafer W located on the lower (or back) surface thereof 50 mm away from a side end of wafer W (see FIG. 4D).

Figure 4D:
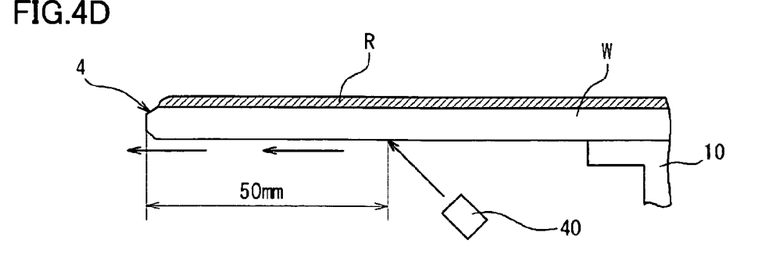
Figure 5:
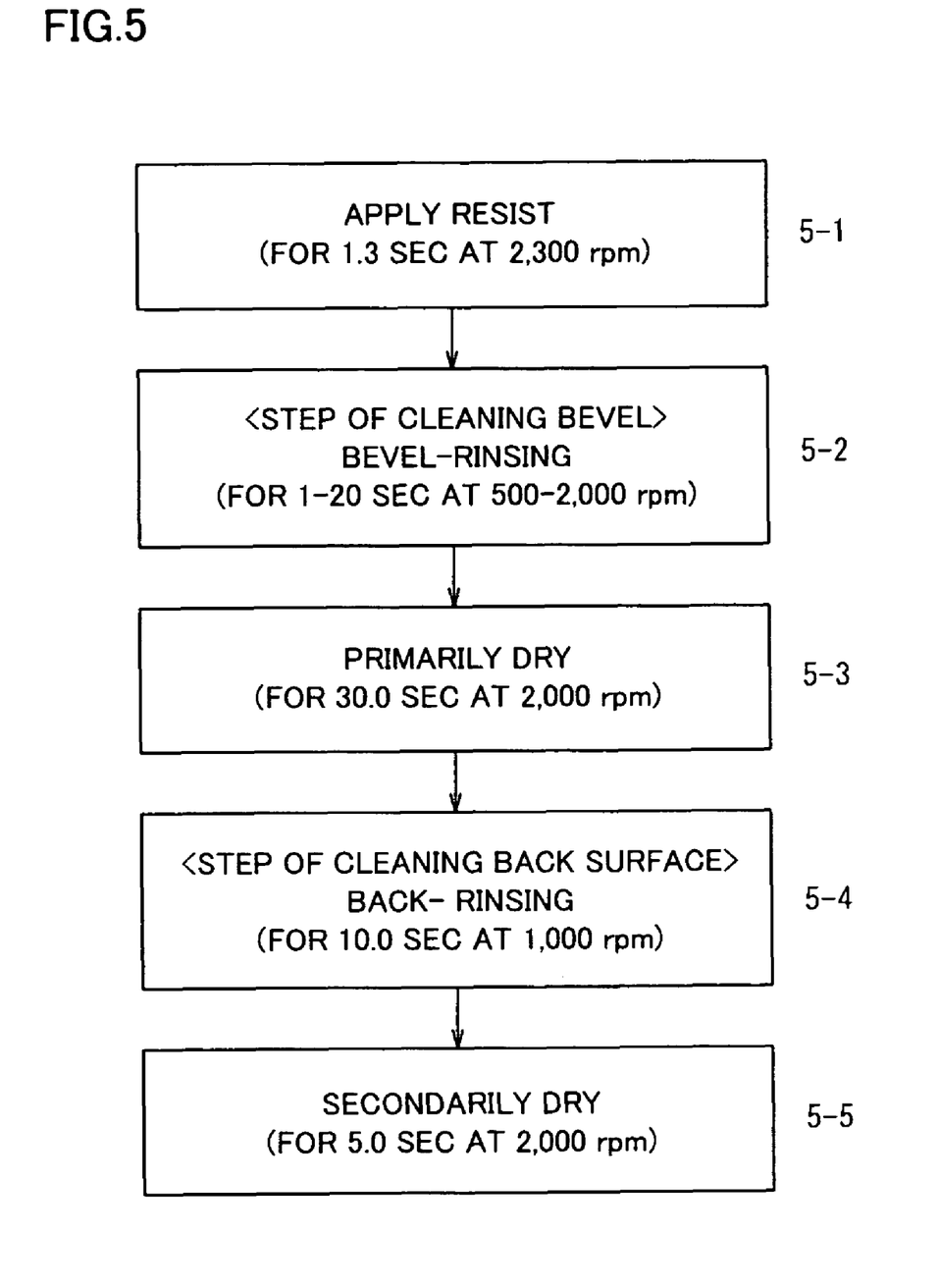
FIG. 5 is a flow chart of the process of the method of processing a substrate in the present invention.

The first embodiment of the resist application apparatus with the substrate processing apparatus of the present invention applied thereto operates in a manner as will now be described with reference to FIGS. 4A-4D and 5. Initially, as shown in FIG. 4A, wafer W, held by spin chuck 10, receives resist dropped through resist application nozzle 20. As spin chuck 10 rotates the wafer, the wafer thus has a surface with resist R applied thereon (a resist application step or a step 5-1). After the resist has been applied when resist R applied on wafer W excessively is spun away and wafer W no longer has such excess of the resist scattering away therefrom, i.e., before a predetermined period of time within five seconds, e.g., one second elapses, and resist R applied on wafer W dries, cleaning liquid L is jetted (or supplied) through bevel cleaning nozzle 30 to wafer W located at beveled portion 4 at surface 3 adjacent to and lower than side end surface 1, and side end surface 1, as shown in FIG. 4B, or for wafer W having a notch, the cleaning liquid is jetted (or supplied) through the nozzle toward a portion of the wafer located 2-5 mm inner than its peripheral edge, as shown in FIG. 4C, to remove resist adhering to beveled portion 4 (a bevel cleaning step or a step 5-2). Note that in that case, the period of time required to dry the resist can previously be determined from the resist's material (or composition). Accordingly, when cleaning liquid L should be supplied through bevel cleaning nozzle 30 can be set in accordance with the resist's material (or composition). The resist adhering to beveled portion 4 is removed by rinsing the bevel for a predetermined period of time (e.g., 10.0 sec) to remove resist R on beveled portion 4 and subsequently, as shown in FIG. 4D, cleaning liquid L supplied through bevel cleaning nozzle 30 is stopped and spin chuck 10 is rotated at the same speed (e.g., 2,000 rpm) as that in rinsing the bevel to primarily dry the wafer (a step 5-3). After the wafer is primarily dried for a predetermined period of time (e.g., 30.0 sec), spin chuck 10 is rotated slowly (for example at 1,000 rpm) and from back surface cleaning nozzle 40 cleaning liquid L is jetted (or supplied) to a portion of wafer W located at a peripheral portion thereof at a lower (or back) surface adjacent to beveled portion 4 at a position 50 mm away from the side end of the peripheral edge of the wafer to remove resist R adhering to the back surface (a back surface cleaning step or a step 5-4). Resist R adhering on the back surface is removed by back-rinsing performed for a predetermined period of time (e.g., 10.0 sec) and subsequently the cleaning liquid supplied through back surface cleaning nozzle 40 is stopped and spin chuck 10 is then rotated fast (for example at 2,000 rpm) to spin the cleaning liquid away from wafer W to (secondarily) dry it to complete the application of the resist (a step 5-5).

Second Embodiment

Figure 6:
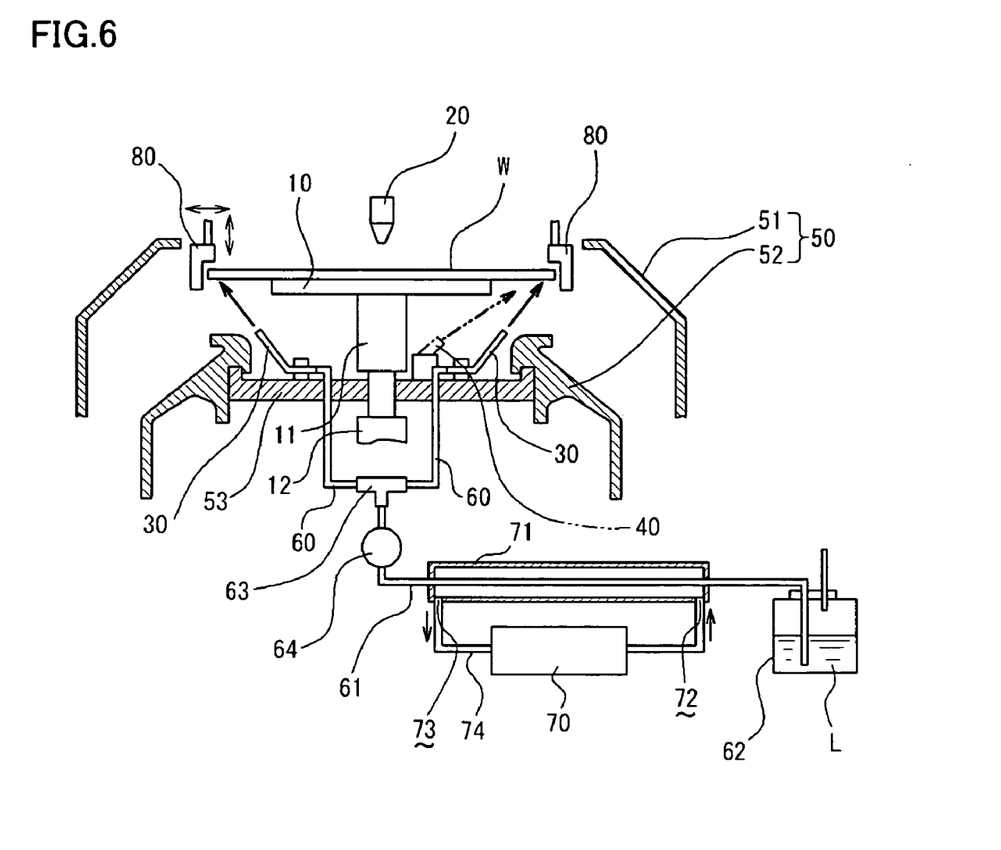
FIG. 6 is a schematic cross section of a second embodiment of the resist application apparatus with the substrate processing apparatus of the present invention applied thereto.

With reference to FIG. 6, a second embodiment is characterized by additionally introducing an assistive nozzle 80 provided at two positions closer to a peripheral edge of wafer W, which is held by spin chuck 10, opposite each other to reserve a cleaning liquid contacting a peripheral portion of wafer W. In this example, assistive nozzle 80 is formed to be horizontally and vertically movable by a movement mechanism (not shown). As the movement mechanism drives it, assistive nozzle 80 is moved to a position adjacent to the peripheral edge of wafer W for use and to a standby position.

Figure 7:
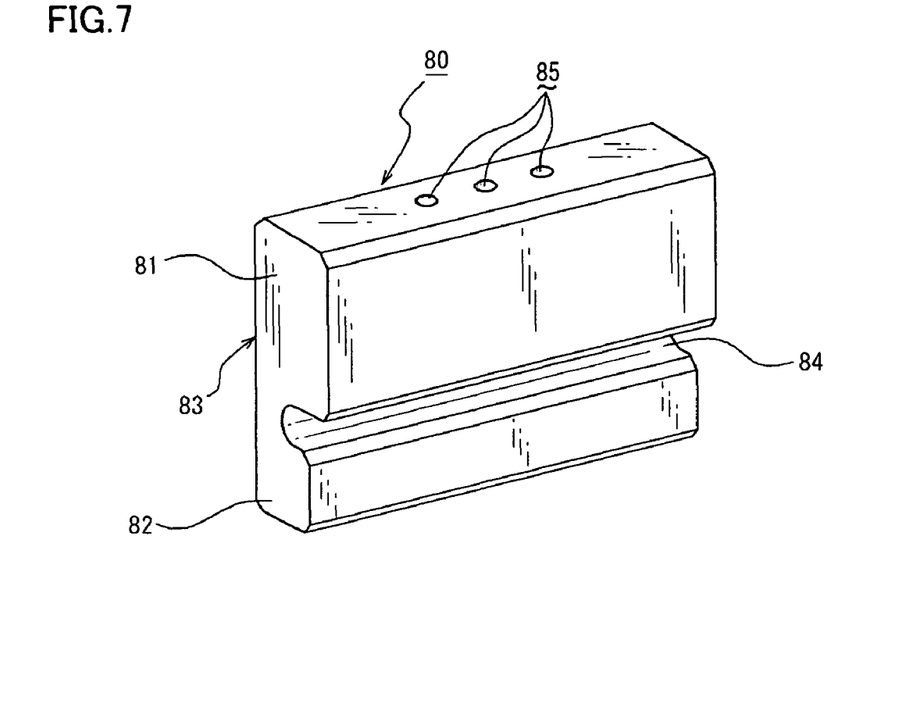
FIG. 7 is a perspective view of an assistive nozzle in the present invention.

As shown in FIG. 7, assistive nozzle 80 has a nozzle block 83 generally in the from of an inverted letter L having a rectangular, expanded and raised head portion 81 and a rectangular foot portion 82 located at an outer lower end of head portion 81. Foot portion 82 at an inner surface thereof located in a vicinity immediately under head portion 81 is provided with a cleaning liquid receiving groove 84. Head portion 81 has a plurality of (in the example shown in the figure, three) paths 85 passing therethrough from a top portion thereof to reach over cleaning liquid receiving groove 84.

Figure 8A:
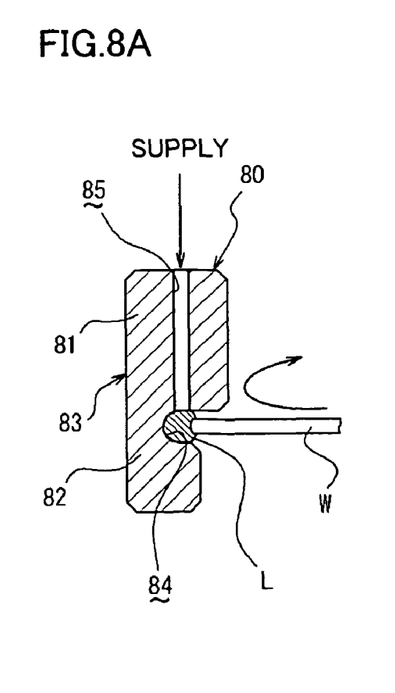
FIGS. 8A and 8B are schematic cross sections of the above assistive nozzle in different specifications, respectively.
Figure 8B:
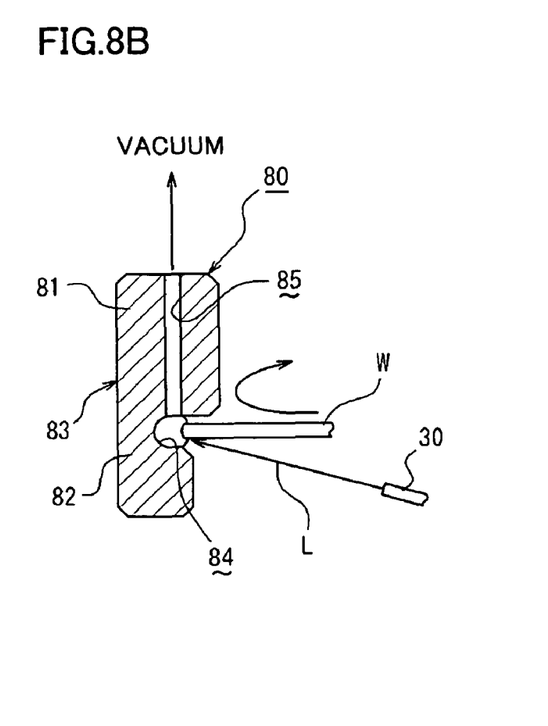

Assistive nozzle 80 thus configured allows the same solvent as cleaning liquid L supplied through paths 85 to be reserved in cleaning liquid receiving groove 84, while the cleaning liquid can be brought into contact with the peripheral portion of wafer W, as shown in FIG. 8A, to remove resist remaining on wafer W at the peripheral portion. Furthermore, as another example of employing assistive nozzle 80, as shown in FIG. 8B, while cleaning liquid L supplied through bevel cleaning nozzle 30 is supplied into cleaning liquid receiving groove 84, paths 85 can be vacuumed by a vacuuming unit (not shown) to cause the cleaning liquid temporarily reserved in cleaning liquid receiving groove 84 to contact wafer W only at the peripheral, beveled portion 4 to remove resist remaining on wafer W at the peripheral portion.

The remainder of the second embodiment is identical to that of the first embodiment. Accordingly it is identically denoted and will not be described repeatedly.

Third Embodiment

Figure 9A:
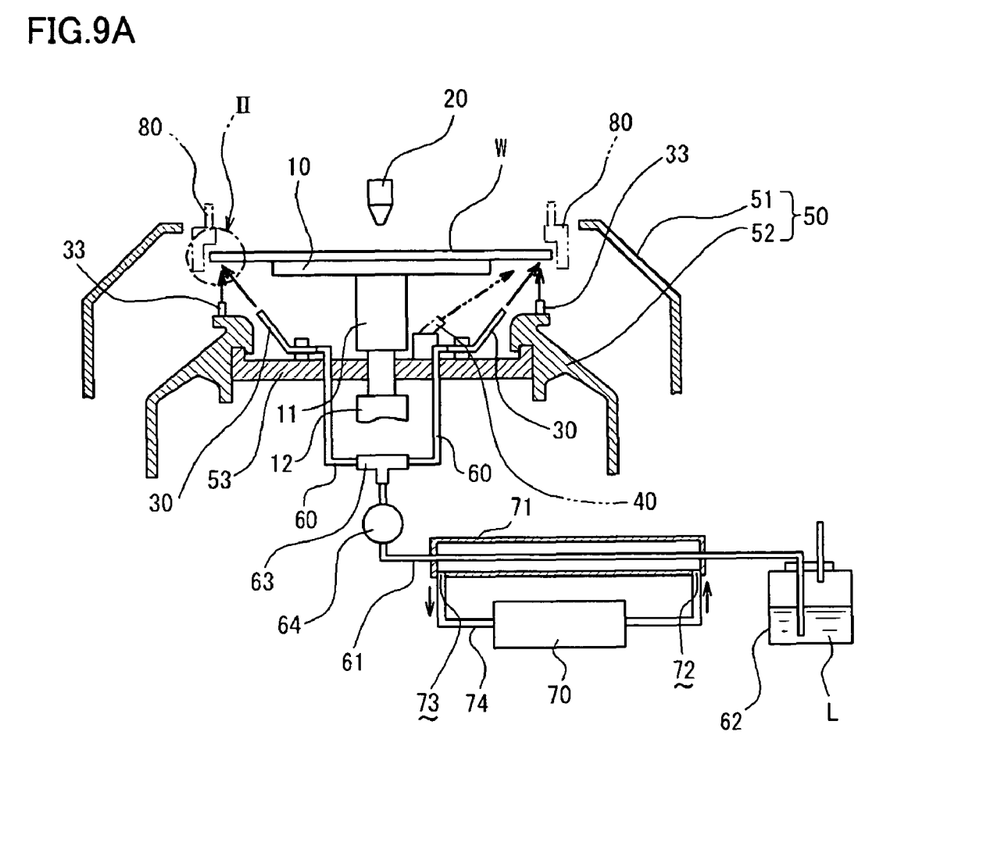
FIG. 9A is a schematic cross section of a third embodiment of the resist application apparatus with the substrate processing apparatus of the present invention applied thereto.
Figure 9B:
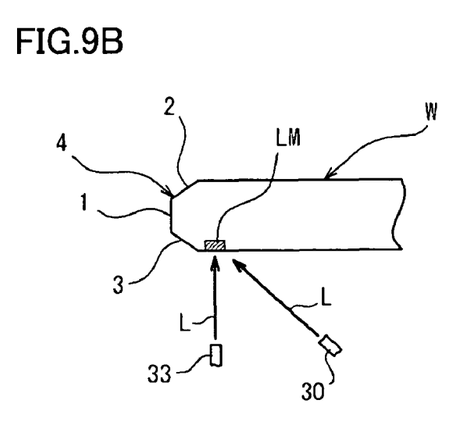
FIG. 9B is an enlarged view of a portion II shown in FIG. 9A.
Figure 9C:
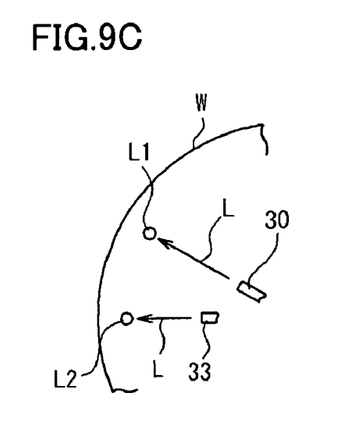
FIG. 9C is a schematic bottom view indicating a position at which a cleaning liquid is supplied.

With reference to FIGS. 9A-9C, a third embodiment is characterized in that beveled portion 4 is supplied with a cleaning liquid ($C_6H_{10}O$) through a nozzle configured of bevel cleaning nozzle 30 as described above and a plurality of (e.g., two) assistive bevel cleaning nozzles 33 (hereinafter referred to as assistive cleaning nozzle 33).

In this example, assistive cleaning nozzle 33 is mounted to be erect at a top portion of inner cup 52 located immediately under an area of the back surface of wafer W inner than and adjacent to beveled portion 4 (e.g., an area 3 mm inner than an outer circumference of wafer W). Note that assistive cleaning nozzle 33 may be mounted at a position other than the top portion of inner cup 52. Assistive cleaning nozzle 33 allows cleaning liquid L to be jetted (or supplied) to wafer W toward the area inner than and adjacent to beveled portion 4 and thus cooperate with cleaning liquid L jetted (or supplied) through bevel cleaning nozzle 30 to together remove resist adhering to beveled portion 4. It should be noted that in this example, as shown in FIG. 9C, cleaning liquid L jetted (or supplied) through bevel cleaning nozzle 30 and that jetted (or supplied) through assistive cleaning nozzle 33 are supplied to different locations L1 and L2.

Thus jetting (or supplying) cleaning liquid L through bevel cleaning nozzle 30 and assistive cleaning nozzle 33 can provide a reduced cleaning period of time. Furthermore, if wafer W has a laser mark LM formed (or carved) in the area inner than and adjacent to beveled portion 4, assistive cleaning nozzle 33 can jet (or supply) cleaning liquid L to remove a residue of the cleaning liquid that remains in the portion of laser mark LM, and also prevent a turbulent flow of the cleaning liquid that is attributed to laser mark LM. This can provide improved cleaning performance.

Note that the remainder of the third embodiment is identical to those of the first and second embodiments. Accordingly, it is identically denoted and will not be described repeatedly.

Figure 10:
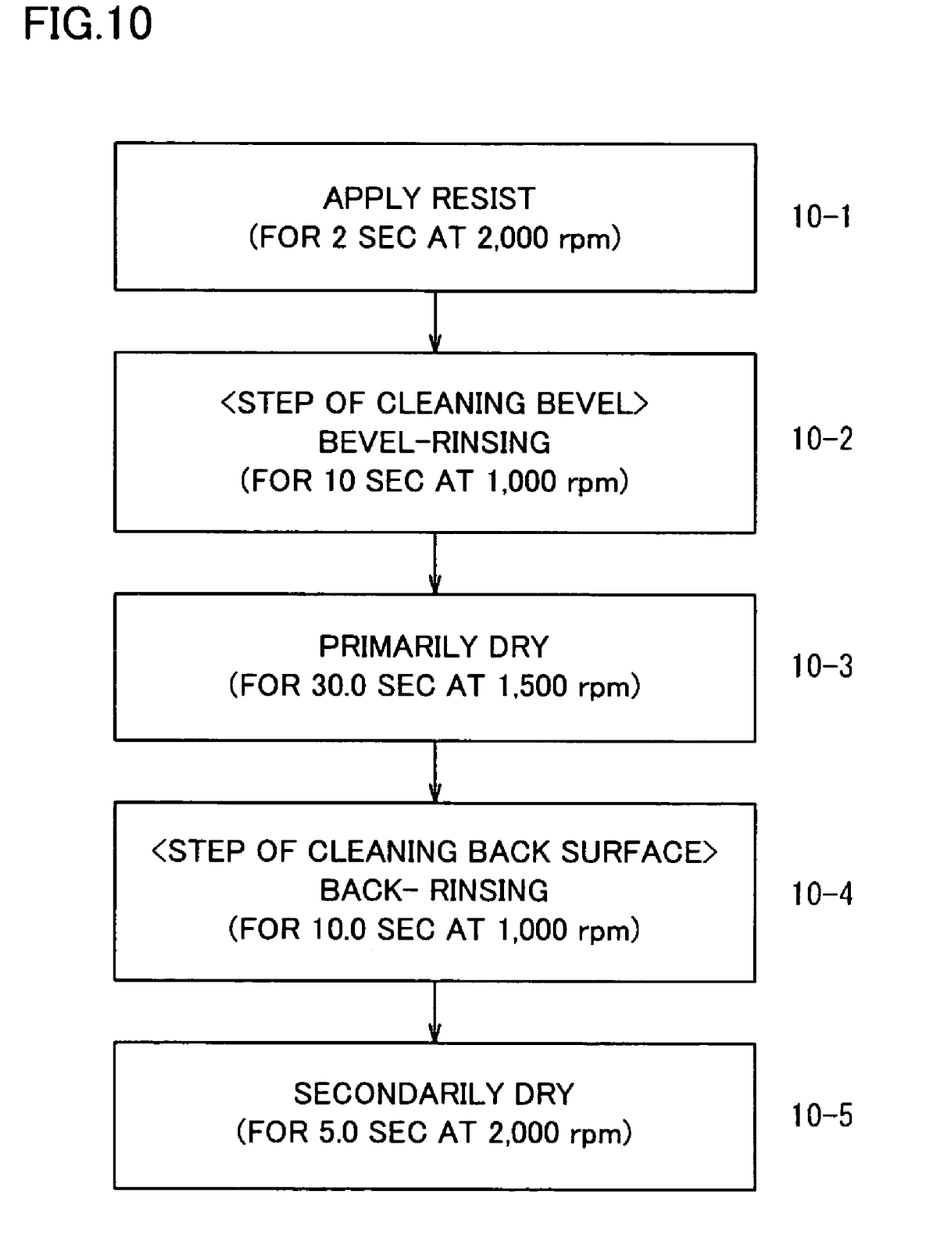
FIGS. 10, 11 and 12 are flow charts of another, still another, and further still another processes, respectively, of the method of processing a substrate in the present invention.

The third embodiment operates in a manner as will be described hereinafter with reference to FIGS. 10-12. In the third embodiment, as shown in FIG. 10, immediately after resist is applied in a resist application step (a step 10-1), more specifically, after the resist is applied when resist R applied on wafer W excessively is spun away and wafer W no longer has such excess of the resist scattering away therefrom, i.e., before a predetermined period of time within five seconds, e.g., one second elapses, and resist R applied on wafer W dries, cleaning liquid L is jetted (or supplied) through bevel cleaning nozzle 30 and assistive bevel cleaning nozzle 33 to a portion of wafer W located at beveled portion 4 at surface 3 adjacent to and lower than side end surface 1 or side end surface 1, and the area inner than and adjacent to beveled portion 4 to remove resist adhering to beveled portion 4 (a bevel cleaning step or a step 10-2). The bevel cleaning step is followed by a primary drying step (a step 10-3)→a back surface cleaning step (a step 10-4)→a secondary drying step (a step 10-5) to complete the application of the resist, similarly as described in the first embodiment.

Figure 11:
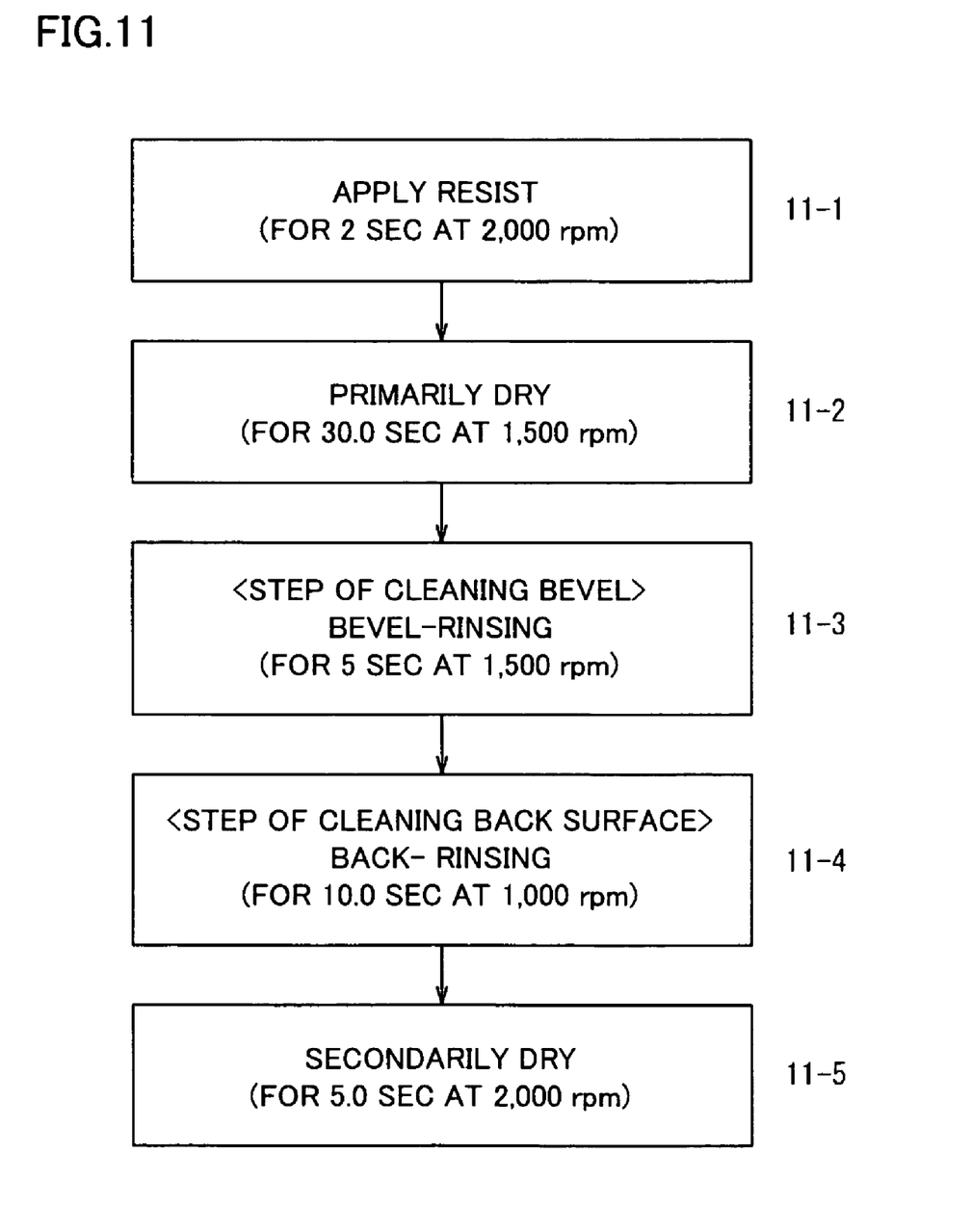

Furthermore in another resist application process a cleaning process is performed in a procedure, as shown in FIG. 11: after a resist application step (a step 11-1) is performed to apply resist, a first drying step (a step 11-2) is performed, and before resist R dries, cleaning liquid L is jetted (or supplied) through bevel cleaning nozzle 30 and assistive bevel cleaning nozzle 33 to a portion of wafer W located at beveled portion 4 at surface 3 adjacent to and lower than side end surface 1 or side end surface 1, and the area inner than and adjacent to beveled portion 4 to remove resist adhering to beveled portion 4 (a bevel cleaning step or a step 11-3). The bevel cleaning step is followed by a back surface cleaning step (a step 11-4)→a secondary drying step (a step 11-5) to complete the application of the resist, similarly as described in the first embodiment.

Figure 12:
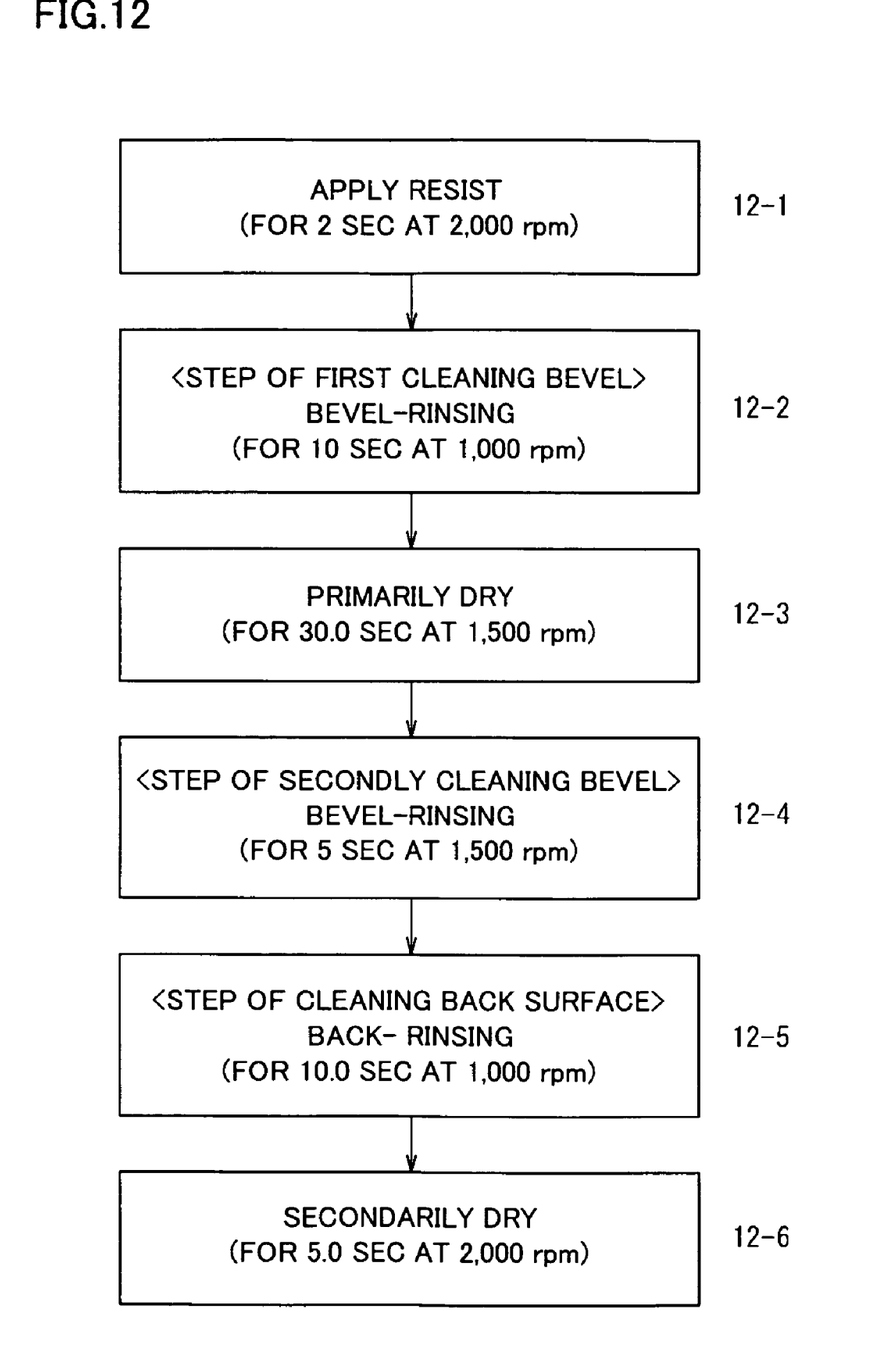

Furthermore in another resist application process for example applying resist on wafer W having laser mark LM formed therein a cleaning process is performed in a procedure, as shown in FIG. 12: immediately after resist is applied in a resist application step (a step 12-1), more specifically, after the resist is applied when resist R applied on wafer W excessively is spun away and wafer W no longer has such excess of the resist scattering away therefrom, i.e., before a predetermined period of time within five seconds, e.g., one second elapses, and resist R applied on wafer W dries, cleaning liquid L is jetted (or supplied) through bevel cleaning nozzle 30 to a portion of wafer W located at beveled portion 4 at surface 3 adjacent to and lower than side end surface 1 or side end surface 1, as shown in FIG. 4B, or for wafer W having a notch, the cleaning liquid is jetted (or supplied) through the nozzle to a portion of the wafer located 2-5 mm inner than its peripheral edge, as shown in FIG. 4C, to remove resist adhering to beveled portion 4 (a first bevel cleaning step or a step 12-2). In the first bevel cleaning step, beveled portion 4 is cleaned before resist R dries. This allows resist R to be removed in a meltable condition. Note that in the first bevel cleaning step assistive cleaning nozzle 30 may jet (or supply) cleaning liquid L to the area of wafer W inner than and adjacent to beveled portion 4.

After the first bevel cleaning (or rinsing) step is performed for a predetermined period of time (e.g., 10 seconds) to remove resist R on beveled portion 4, cleaning liquid L supplied through bevel cleaning nozzle 30 or bevel cleaning nozzle 30 and assistive cleaning nozzle 33 is stopped and spin chuck 10 is rotated at a speed (for example of 1,500 rpm) faster than that (e.g., 1,000 rpm) in rinsing the bevel to primarily dry the wafer (a step 12-3). After the wafer is primarily dried for a predetermined period of time (e.g., 30.0 sec) spin chuck 10 is rotated at the same speed (for example of 1,500 rpm) as that applied in primarily drying the wafer, while assistive cleaning nozzle 33 jets (or supplies) cleaning liquid L to the area of wafer W inner than and adjacent to beveled portion 4 to remove the cleaning liquid remaining in the portion of laser mark LM formed in wafer W and also prevent a turbulent flow of the cleaning liquid that is attributed to laser mark LM (a second bevel cleaning step or a step 12-4). The second bevel cleaning step can clean off and thus remove resist R remaining as a slight contaminant on a surface of beveled portion 4 after the wafer is primarily dried. The second bevel cleaning step is followed by a back surface cleaning step (or a step 12-5)→a secondary drying step (or a step 12-6) to complete the application of the resist, similarly as described in the first embodiment.

Note that bevel cleaning nozzle 30 and assistive cleaning nozzle 33 may be adjusted in flow rate for discharging (or supplying) cleaning liquid to allow the first bevel cleaning step to be performed with bevel cleaning nozzle 30 alone and the second bevel cleaning step to be performed with assistive cleaning nozzle 30 alone.

Note that the above embodiments have been described with a liquid to be applied implemented by resist, they are also similarly applicable to a liquid to be applied other than resist, e.g., spin on glass (SOG) liquid.

EXAMPLE

The above described resist application apparatus with the substrate processing apparatus of the present invention applied thereto and a conventional resist application apparatus were compared in an experiment in a resist removal process and in how long they take to perform the process.

Conditions for the Experiment

Resist: PAR (product name)

Solvent: cyclohexanone ($C_6H_{10}O$)

Flow rate for bevel-rinsing: 100 ml/min (in total for two nozzles)

Flow rate for back-rinsing: 100 ml/min (in total for two nozzles)

Under the above indicated conditions the experiment was conducted. The conventional apparatus provided a result as shown in Table 1 and the present apparatus provided a result as shown in Table 2.

TABLE 1

| STEP | Time (s) | Speed (rpm) | Acceleration (rpm/s) | Dispense |
|---|---|---|---|---|
| 1 | 1.3 | 2,300 | 10,000 | resist |
| 2 | 1 | 2,300 | 10,000 | |
| 3 | 50 | 2,000 | 10,000 | |
| 4 | 120 | 1,000 | 10,000 | back-rinsing *) |
| 5 | 1 | 1,000 | 10,000 | |
| 6 | 5 | 2,000 | 10,000 | |

*) EBR arm drive time

TABLE 2

| STEP | Time (s) | Speed (rpm) | Acceleration (rpm/s) | Dispense |
|---|---|---|---|---|
| 1 | 1.3 | 2,300 | 10,000 | resist |
| 2 | 1 | 2,300 | 10,000 | |
| 3 | 1 to 20 | 500 to 2,000 | 10,000 | bevel-rinsing |
| 4 | 30 | 2,000 | 10,000 | |
| 5 | 10 | 1,000 | 10,000 | back-rinsing |
| 6 | 5 | 2,000 | 10,000 | |

The experiment has revealed that a conventional resist removal process employing cyclohexanone ($C_6H_{10}O$) as a cleaning liquid and performing back-rinsing after resist is dried, typically requires a period of time of approximately 120 seconds, whereas a resist removal process performed in accordance with the present invention requires a period of time of approximately 30 seconds even with that for bevel-rinsing and that for back-rinsing added together, and can thus be performed within a significantly reduced period of time.

Furthermore in the third embodiment when two bevel cleaning nozzles 30 and two assistive cleaning nozzles 33 were used to perform an experiment under the following conditions:

Resist: PAR (product name)

Solvent: cyclohexanone ($C_6H_{10}O$)

Flow rate for bevel-rinsing: 160 ml/min (in total for 4 nozzles)

Bevel cleaning nozzle 30: 50ml/min (for a single nozzle)

Assistive cleaning nozzle 33: 30 ml/min (for a single nozzle)

Flow rate for back-rinsing: 100 ml/min (in total for two nozzles), a result shown in FIGS. 3 and 4 was obtained.

TABLE 3

| STEP | Time (s) | Speed (rpm) | Acceleration (rpm/s) | Dispense |
|---|---|---|---|---|
| 1 | 2 | 2,000 | 10,000 | resist |
| 2 | 1 | 100 | 30,000 | |
| 3 | 30 | 1,500 | 10,000 | |
| 4 | 5 | 1,500 | 10,000 | bevel-rinsing |
| 5 | 10 | 1,000 | 10,000 | back-rinsing |
| 6 | 5 | 2,000 | 10,000 | |

TABLE 4

| STEP | Time (s) | Speed (rpm) | Acceleration (rpm/s) | Dispense |
|---|---|---|---|---|
| 1 | 2 | 2,000 | 10,000 | resist |
| 2 | 1 | 100 | 30,000 | |
| 3 | 10 | 1,000 | 10,000 | bevel-rinsing |
| 4 | 30 | 1,500 | 10,000 | |
| 5 | 5 | 1,500 | 10,000 | bevel-rinsing |
| 6 | 10 | 1,000 | 10,000 | back-rinsing |
| 7 | 5 | 2,000 | 10,000 | |

The experiment has revealed that in the third embodiment of the present invention the resist removal process requires a period of time of no more than 25 seconds even with that for bevel-rinsing and that for back-rinsing added together and can thus be performed within a significantly reduced period of time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of processing a substrate, performing a process to form a film on a surface of a substrate, comprising the steps of:
rotating said substrate with a first liquid dropped thereon;
supplying a second liquid, before said first liquid dries and said film is formed, to a beveled portion of said substrate located at a peripheral edge of said substrate to remove said first liquid applied on said beveled portion;
drying said first liquid, after the step of supplying said second liquid in the vicinity of said beveled portion;
supplying said second liquid, after the drying said first liquid, to a portion of said substrate located at a back surface of said substrate adjacent to said beveled portion to remove said first liquid applied on said back surface; and
after the step of supplying said second liquid at said back surface of said substrate, drying said second liquid,
wherein an assistive nozzle located adjacent to the beveled portion of said substrate supplies said second liquid to the beveled portion of said substrate, and
wherein the step of supplying said second liquid to the beveled portion causes said second liquid to contact only said beveled portion of the substrate for cleaning.

2. The method according to claim 1, wherein the step of rotating said substrate includes the step of:
spinning said first liquid applied on said substrate away from said surface of said substrate,
wherein the step of supplying the second liquid to a portion of said substrate located at a peripheral edge thereof starts within a period of time of five seconds counted from the step of spinning.

3. The method according to claim 1, wherein the step of supplying said second liquid to a portion of said substrate located at a peripheral edge thereof includes supplying said second liquid from a back surface of said substrate toward said beveled portion.

4. The method according to claim 1, wherein in the step of supplying said second liquid, said substrate is rotated at a speed allowing said second liquid to run along said substrate to reach a portion of said beveled portion located at a surface upper than a side end of said substrate.

5. The method according to claim 1, wherein in the step of supplying said second liquid, said substrate is rotated at a speed within a range of 500 rpm to 2,000 rpm and no faster than that applied to rotate said substrate in the step of drying.

6. The method according to claim 1, wherein the step of supplying said second liquid is performed for a period of time set depending on a type and a viscosity of said first liquid to be applied, and a type of a solvent of said second liquid and a viscosity and a temperature of said second liquid.

7. The method according to claim 1, wherein said second liquid is supplied to the back surface of the substrate within a range of between 2-5 mm away from a side end of said substrate.

8. The method according to claim 1, wherein said second liquid is supplied to said portion of said substrate located at a peripheral edge thereof in a vicinity of said beveled portion from a first nozzle and a second nozzle, the first nozzle disposed between a rotational axis of the substrate and a side end of said substrate, and the second nozzle mounted in an erect position immediately under said substrate and disposed radially inward of said beveled portion and adjacent to said beveled portion, and
wherein the first nozzle supplies said second liquid toward an outside of said substrate.

9. The method accordingly to claim 1, wherein a nozzle supplying said second liquid is configured to be adjusted angularly and positionally depending on a diameter and a geometry of said substrate.

10. A method of processing a substrate, performing a process to form a film on a surface of a substrate, comprising the steps of:
rotating said substrate with a first liquid dropped thereon;
supplying a second liquid from an assistive nozzle, before said first liquid dries and said film is formed, to a beveled portion of said substrate located at a peripheral edge of said substrate to remove said first liquid applied on said beveled portion;
drying said first liquid, after the step of supplying said second liquid at said beveled portion;
supplying said second liquid, after the drying said first liquid, to a portion of said substrate located at a back surface of said substrate adjacent to said beveled portion to remove said first liquid applied on said back surface; and
after the step of supplying said second liquid at said back surface of said substrate, drying said second liquid,
wherein the assistive nozzle has a nozzle block and a receiving groove disposed in the nozzle block, the receiving groove reserving the second liquid such that the peripheral edge of the substrate contacts the second liquid reserved in the receiving groove to remove the first liquid remaining on the substrate at the peripheral edge.

11. The method according to claim 10, wherein before the first liquid dries, the second liquid is supplied from both a cleaning nozzle and the assistive nozzle, the assistive nozzle being located directly adjacent to the peripheral edge of the substrate, and the cleaning nozzle being located to supply the second liquid to the portion of said substrate located at the back surface of said substrate.

12. The method according to claim 10, wherein the assistive nozzle is configured to move to a first position adjacent to the peripheral edge of the substrate for use and to a second position for standby.

13. The method according to claim 10 wherein the second liquid is supplied to the receiving groove through one or more paths disposed in the nozzle block.

* * * * *